US010435048B2

United States Patent
Saunders et al.

(10) Patent No.: US 10,435,048 B2
(45) Date of Patent: Oct. 8, 2019

(54) METHODS AND SYSTEMS FOR ALERTING A USER TO THE PRESENCE OF A FAULT IN AN ELECTROMECHANICAL SYSTEM IN A RAILWAY INFRASTRUCTURE

(71) Applicant: Thales Holdings UK Plc, Surrey (GB)

(72) Inventors: William Saunders, Reading (GB); Steve Samuels, Reading (GB)

(73) Assignee: THALES HOLDINGS UK PLC, Reading (GB)

( * ) Notice: Subject to any disclaimer, the term of this patent is extended or adjusted under 35 U.S.C. 154(b) by 31 days.

(21) Appl. No.: 15/569,971

(22) PCT Filed: Feb. 9, 2016

(86) PCT No.: PCT/GB2016/050295
§ 371 (c)(1),
(2) Date: Oct. 27, 2017

(87) PCT Pub. No.: WO2016/174382
PCT Pub. Date: Nov. 3, 2016

(65) Prior Publication Data
US 2018/0154913 A1    Jun. 7, 2018

(30) Foreign Application Priority Data
Apr. 28, 2015 (GB) .................................. 1507233.3

(51) Int. Cl.
*B61L 1/20* (2006.01)
*G01R 31/34* (2006.01)
(Continued)

(52) U.S. Cl.
CPC ................. *B61L 1/20* (2013.01); *B61L 1/025* (2013.01); *B61L 23/042* (2013.01);
(Continued)

(58) Field of Classification Search
CPC .......... B61L 1/20; B61L 1/025; B61L 23/042; G01R 1/44; G01R 31/343
See application file for complete search history.

(56) References Cited

U.S. PATENT DOCUMENTS

2004/0167686 A1* 8/2004 Baker ..................... B61L 23/00
701/19

FOREIGN PATENT DOCUMENTS

| GB | 2313611 A    | 12/1997 |
| KR | 101453301 B1 | 10/2014 |
| RU | 2288128 C1   | 11/2006 |

OTHER PUBLICATIONS

International Search Report and Written Opinion for PCT/GB2016/050295, dated Oct. 5, 2016.
(Continued)

*Primary Examiner* — Jason C Smith
(74) *Attorney, Agent, or Firm* — Hauptman Ham, LLP (57) ABSTRACT

A computer-implemented method for alerting a user to the presence of a fault in an electromechanical system in a railway infrastructure, the method comprising: receiving electrical usage data indicative of the value of an electrical usage parameter associated with the electromechanical system; receiving temperature data indicative of the present temperature of the electromechanical system; determining, based on a predetermined relationship between the electrical usage parameter and the temperature, whether or not the value of the electrical usage parameter is indicative of a fault in the electromechanical system and if so, issuing an alert to indicate the presence of the fault.

8 Claims, 9 Drawing Sheets

(51) Int. Cl.
*B61L 27/00* (2006.01)
*B61L 1/02* (2006.01)
*B61L 23/04* (2006.01)
*G01R 1/44* (2006.01)

(52) U.S. Cl.
CPC ............ *B61L 27/0088* (2013.01); *G01R 1/44* (2013.01); *G01R 31/343* (2013.01)

(56) References Cited

OTHER PUBLICATIONS

Combined Search and Examination Report for GB 1507233.3, dated Sep. 24, 2015.
International Preliminary Report on Patentability for PCT/GB2016/050295, dated Nov. 9, 2017.

* cited by examiner

METHODS AND SYSTEMS FOR ALERTING A USER TO THE PRESENCE OF A FAULT IN AN ELECTROMECHANICAL SYSTEM IN A RAILWAY INFRASTRUCTURE

FIELD

Embodiments described herein relate to methods and systems for alerting a user to the presence of a fault in an electromechanical system in a railway infrastructure.

BACKGROUND

Condition monitoring of railway assets is used to determine what state the many assets belonging to the railway network are in, in order to schedule maintenance, detect potential faults or unusual operation. Systems are employed to monitor one or many aspects of an asset and based on the value(s) of the measures, an alarm may be raise to indicate a particular condition.

One example of a type of railway asset that is monitored is a points machine (also known as a switch)—an electromechanical system that allows trains to be guided from one track to another. The switch is operated by an electrical motor. Remote condition monitoring systems are used to measure electrical usage parameter(s) associated with the switch during its operation and compare the value(s) with threshold values; for example, a remote monitoring system may measure the average current of the electrical motor during its operation and compare the average current with a static threshold. If the average current is above the threshold then the system goes through the process of reporting this as unusual/undesirable, and a decision is made as to how to respond.

Conventional monitoring systems generate an unacceptably high number of false positive alarms that are attributed to changes in weather conditions; an estimated 11% of false alarms generated by rail asset remote conditioning systems are attributed to changes in environmental conditions, rather than being genuinely indicative of poor asset condition. The static thresholds currently used may also mean that in some cases, the asset may operate outside of acceptable tolerances, without an alert being issued.

Thus, it is desirable to provide enhanced means for recognising when a railway asset is operating within acceptable tolerances.

SUMMARY

According to a first embodiment, there is provided a computer-implemented method for alerting a user to the presence of a fault in an electromechanical system in a railway infrastructure, the method comprising:
  receiving electrical usage data indicative of the value of an electrical usage parameter associated with the electromechanical system;
  receiving temperature data indicative of the present temperature of the electromechanical system;
  determining, based on a predetermined relationship between the electrical usage parameter and the temperature, whether or not the value of the electrical usage parameter is indicative of a fault in the electromechanical system and if so, issuing an alert to indicate the presence of the fault.

In some embodiments, the predetermined relationship defines the change in the electrical usage parameter as a linear function of the temperature.

In some embodiments, the electrical usage parameter is one of an electrical current being drawn by the electromechanical system, the electrical power being transferred by the electromechanical system, and the voltage across the electromechanical system.

In some embodiments, the predetermined relationship is obtained by comparing measurements of the electrical usage parameter with measurements of temperature during a period in which the electromechanical system is deemed to be functioning within acceptable tolerances.

In some embodiments, the step of determining comprises:
  determining, based on the predetermined relationship, a threshold value for the electrical usage parameter at the present temperature, wherein the threshold, if exceeded, will indicate the presence of a fault in the electromechanical system; and
  determining, whether the value of the electrical usage parameter exceeds the threshold.

In some embodiments, the step of determining comprises:
  calibrating the received electrical usage data using the received temperature data and the predetermined relationship to obtain a calibrated measure of the electrical usage parameter; and
  determining whether the calibrated measure of the electrical usage parameter is above a threshold, said threshold being such as to indicate the presence of a fault in the electromechanical system.

In some embodiments, the step of calibrating the received electrical usage data comprises:
  identifying a baseline temperature at which the threshold is set; and
  using said relationship, together with the received electrical usage data and the received temperature data, to determine a value for the electrical usage parameter that the system would exhibit in the event that the temperature of the environment were at the baseline temperature.

In some embodiments, the electromechanical system is a point switch machine.

In some embodiments, the electrical usage data is indicative of the average electrical current drawn by a motor of the electromechanical system during an operation of the motor.

According to a second embodiment, there is provided a computer readable medium comprising computer executable instructions that when executed by a computer will cause the computer to carry out a method according to the first embodiment.

According to a third embodiment, there is provided a non-transitory computer readable storage medium comprising computer executable instructions that when executed by a computer will cause the computer to carry out a method according to the first embodiment.

BRIEF DESCRIPTION OF DRAWINGS

Embodiments of the invention will now be described by way of example with reference to the accompanying drawings in which.

DETAILED DESCRIPTION

Figure 1:
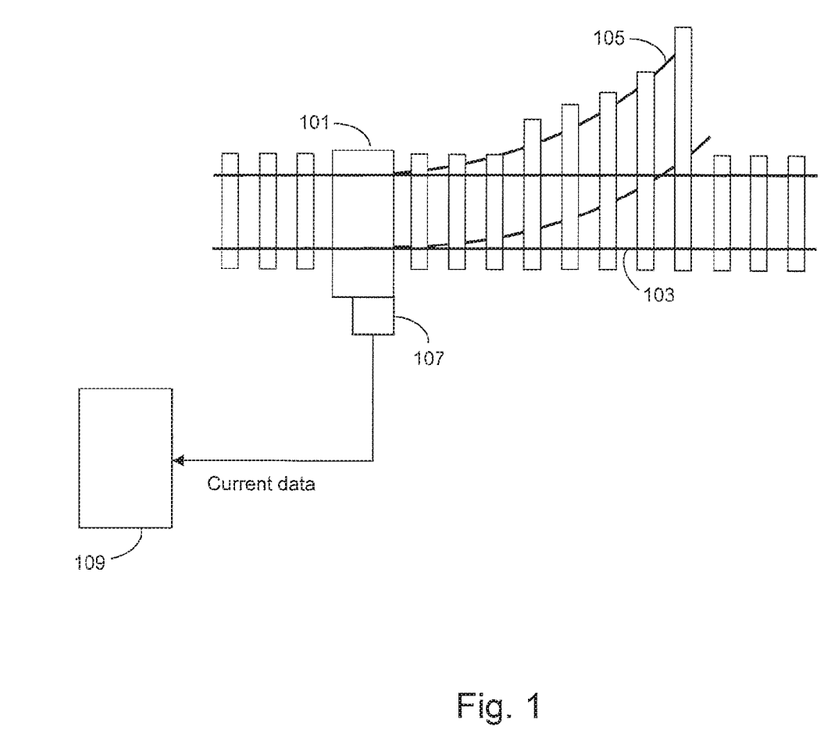
FIG. 1 shows a schematic of a conventional points machine.

FIG. 1 shows a schematic of a conventional points machine 101 used to guide a train from a first track 103 to a second track 105. The points machine is one example of an electromechanical system in the railway infrastructure and is driven by an electric motor 107. When activated, the points machine shifts the rails of the second track 105 slightly, such that a train approaching the intersection between the first track 103 and the second track 105 is diverted onto the second track 105.

In order to monitor the condition of the points machine, a measurement of the machine's electrical usage is made each time the points machine is brought into operation to switch the points. The measurement may be carried out by measuring one of several electrical usage parameters; these parameters may include, for example, the current being drawn by the motor, the voltage drop across the machine, or the power transferred by the machine. Measurements may be made using a suitable meter (current meter, voltmeter, power meter etc.) In the example shown, the measurement is carried out by measuring the average current drawn by the electric motor during the operation. The measurement is output to a remote monitoring facility 109.

Figure 2:
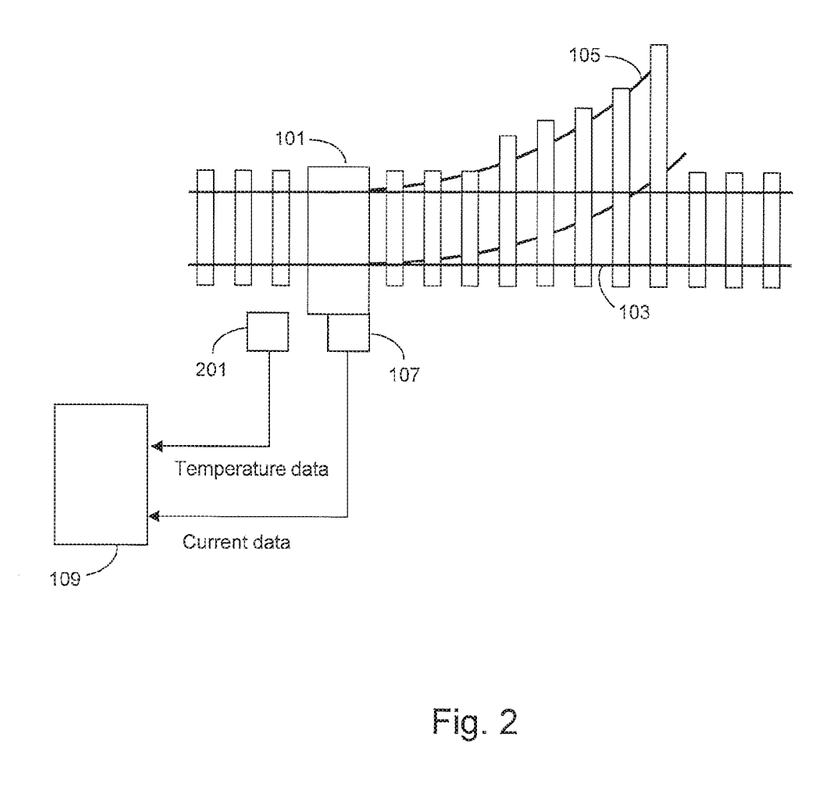
FIG. 2 shows a schematic of a points machine according to an embodiment.

FIG. 2 shows a schematic of a points machine according to an embodiment. For ease of reference, parts having the same function as those shown in FIG. 1 are labelled with the same reference numerals. In this example the measurement of electrical usage is made by determining the average current being drawn by the motor during its operation; as discussed above, it will be understood that other electrical parameters (voltage, power etc.) may be used as the basis for the measurement of electrical usage. In addition to the current monitor, the system of FIG. 2 also includes a temperature sensor 201 that is used to monitor the temperature of the electric motor and/or the environment in which the machine is situated (including the rails themselves, for example). Temperature readings from the sensor 201 are also output to the remote monitoring facility 109. As explained below, by comparing the current readings with the temperature readings, it is possible to obtain more detailed information concerning the state of the points machine, and whether or not the points machine is operating within acceptable tolerances.

Figure 3:
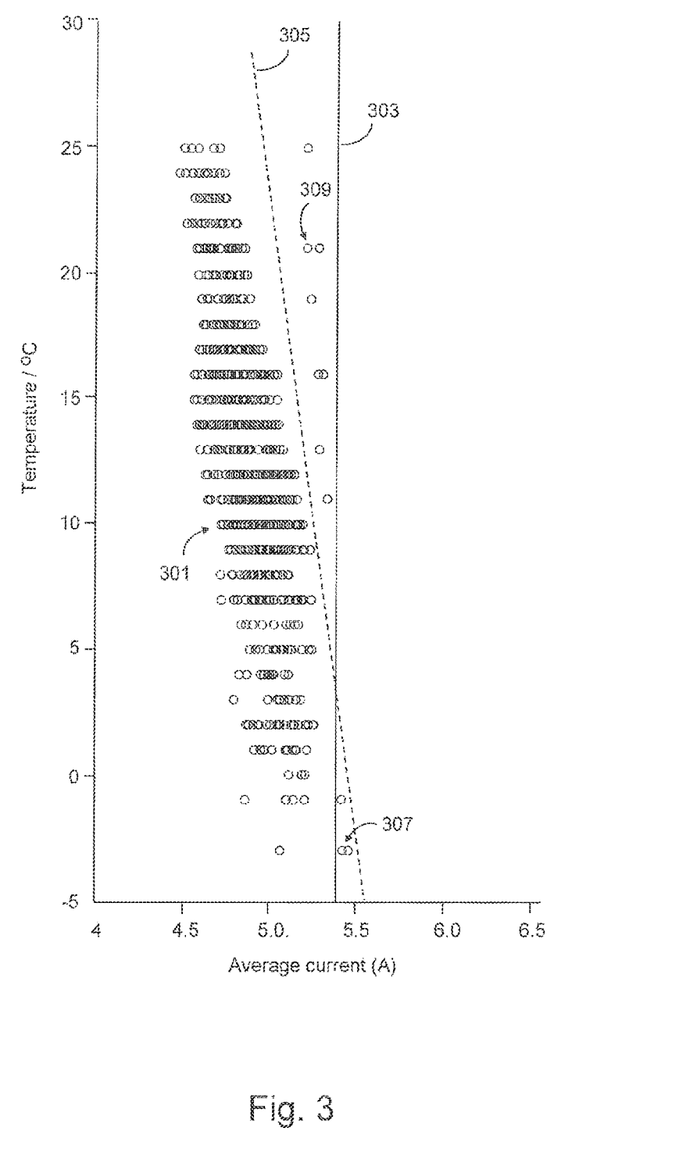
FIG. 3 shows an example of how the average current measured for a points machine varies as a function of temperature.

FIG. 3 shows an example of how a relationship between the value of the electrical usage parameter (in this case, the average current drawn by the motor) and the temperature may be determined by carrying out measurements of the electrical usage parameter at different temperatures. In this example, the average current as measured for each individual operation of the points machine is shown by individual circles 301 (here, an operation refers to the act of switching the points, such that trains will be diverted to one or other of the tracks).

The measurements shown in FIG. 3 indicate a trend towards increased average current as the temperature falls. The trend is depicted by line 305. Conventional methods for monitoring the performance of the points machine rely on the use of a static threshold current, as depicted by the line 303 in FIG. 3. The threshold is set manually, based on the machine performance over a short "calibration" operational window, which may be two weeks long, for example. The threshold may be reset twice a year, for example at the start of summer and winter to accommodate seasonal changes in weather. The reset of the threshold is a manual process, which is based on knowledge held by local maintenance engineers. The threshold 303 will typically be set at a value that is significantly higher than the average operating level for the points machine, in order to reduce the likelihood of false alarms. The precise value for the threshold is based on a trade-off between sensitivity of the system to degrading asset condition and the range of normal operational performance. In such a conventional system (which does not take into account temperature data), a current reading above this threshold will be treated as being indicative of a fault with the points machine. Provided the average current remains below this threshold, the points machine will be treated as operating within acceptable tolerances.

In a conventional system, the shift towards higher currents as the temperature falls means that certain data points that are not necessarily indicative of a fault in the points machine will nevertheless be treated as such if using a static threshold current. At the same time, genuinely anomalous data points may fail to result in an alarm because they do not exceed the static threshold current. For example, with reference to FIG. 3, data points 307 represent current measurements that lie above the static threshold 303 and which would, therefore, be treated as indicative of a fault in the points machine. However, when viewed in the context of the graph as a whole, it can be seen that the data points 307 are consistent with the overall trend in data 305 as having been measured at a particularly low temperature. Thus, the fact that the average current has exceeded the threshold 303 does not necessarily indicate that the points machine is operating with a fault. Conversely, data points 309 represent current readings that are beneath the threshold 303 but which are not consistent with the overall trend in data 305. The measurements 309 indicate that the electric motor is drawing a higher than expected average current and is likely to be operating with a fault. However, since the size of the current is still below the threshold 303, the system will fail to register this as an issue.

It can be seen, therefore, that the conventional method for monitoring the condition of the points machine poses a problem in that the alarm threshold is constant regardless of the temperature, but the average current varies with temperature. This means that a change in temperature may cause the current to rise above the threshold when there is no problem, or to remain below the threshold when there is a problem. Consequently, true alarms may be missed as the threshold cannot be maintained close to the measured signal; this may lead to point failures occurring which could have been prevented with appropriate scheduled maintenance. Additionally, the conventional method will produce a large number of false alarms, which are costly to respond to when there is no issue with the asset.

The above example has focussed on measurements of current, and for the sake of continuity, the following examples will also focus on the use of current as the electrical usage parameter. However, it will be understood that embodiments are not limited to this one particular electrical usage parameter; the relationship between temperature and other electrical usage parameters (including the power transferred by the machine, or the voltage across the machine) may also be determined, with measurements of these other parameters subsequently being used for determining the condition of the points machine.

Figure 4:
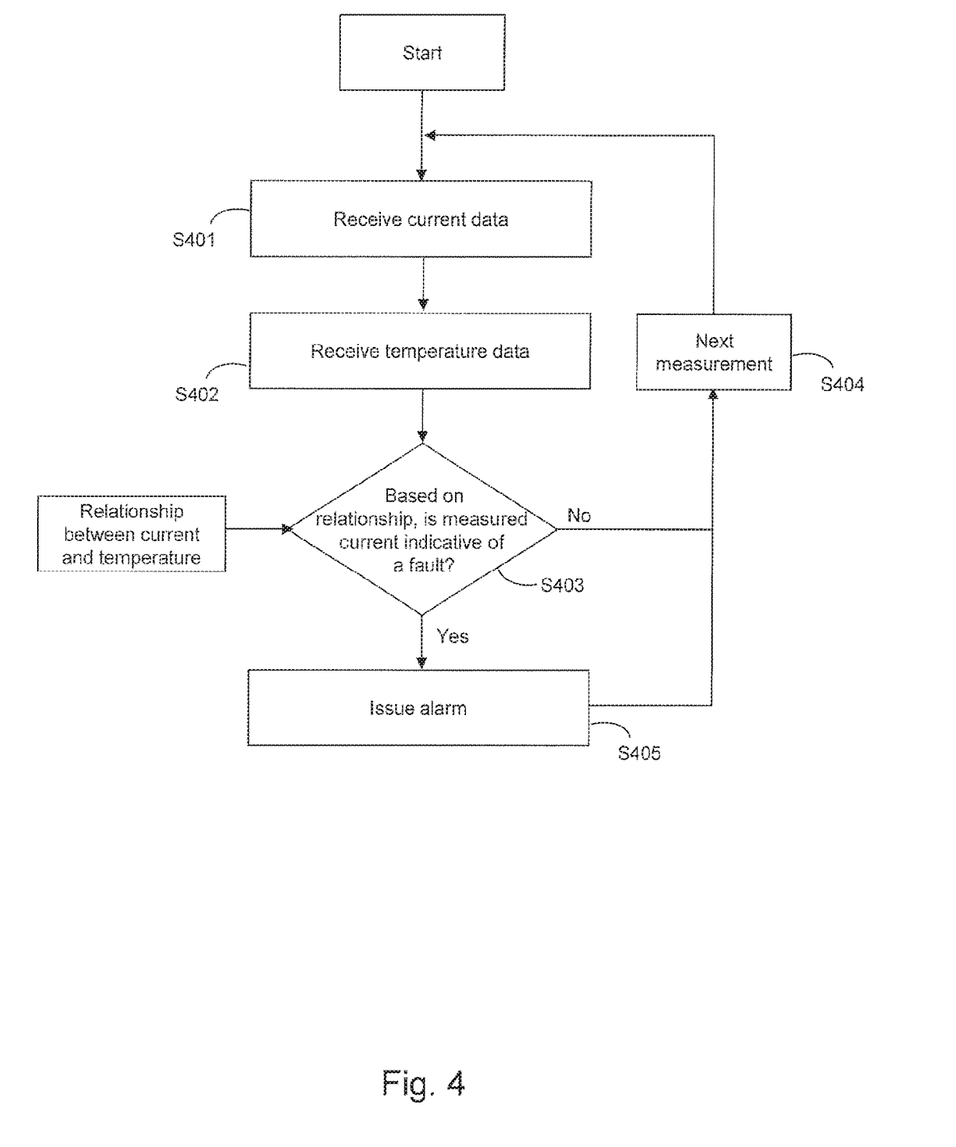
FIG. 4 shows an example of how temperature data may be taken into account when determining if a points machine is operating within acceptable tolerances, according to an embodiment.

FIG. 4 shows an example of how temperature data may be taken into account when determining if a points machine is operating within acceptable tolerances. Beginning in step S401, current data is received from a current monitor associated with the points machine. In step S402, temperature data is received that indicates the temperature of the points machine or in the vicinity of the points machine. The temperature data may be provided by a temperature sensor located inside the points machine or in the vicinity of the points machine. In other embodiments, temperature data may be received from weather stations or may be provided as part of meteorological data from national weather offices such as the UK Met Office, for example.

In step S403, the received current and temperature data is analysed in conjunction with a predetermined model that defines a relationship between the temperature in the vicinity of the points machine and the expected operating current. Based on this relationship, a decision is made as to whether or not the measured current is indicative of a fault in the points machine. In the event it is determined that the measured current is not indicative of a fault, no action is taken until the next time the points machine is operated (step S404) at which point the steps S401-S403 are repeated. In the event that a decision is reached that the measured current is indicative of a fault in the system, an alarm is issued in step S405. The process may then be repeated the next time the points machine is operated. A log may be kept of the number of times an alarm is issued during a given time period (e.g. over the course of 24 hours, a week or a month etc.).

The alarm may take one of a number of different forms. The alarm may be issued as an aural alarm (e.g. a buzzer or siren), or as a visual alarm displayed on a user's monitor screen (here, the user may be a flight engineer, for example, with responsibility for deciding if and when to dispatch maintenance crews to a particular site in the railway network). For example, the alarm may take the form of a flashing light or a pop-up on the user's screen. Alternatively, or in addition, the alarm may be issued by changing a visual property of the asset on the screen. For example, a flight engineer may have a map of the railway network displayed on the screen, with visual representations of the different assets shown at the relevant locations on the map; in the event that a fault is determined to be present in one of those assets, the asset in question may change its size or it shape or its colour on the map. The alarm may also take the form of an electronic message being delivered to a person's personal account, such as by email or SMS text message, for example.

Figure 5:
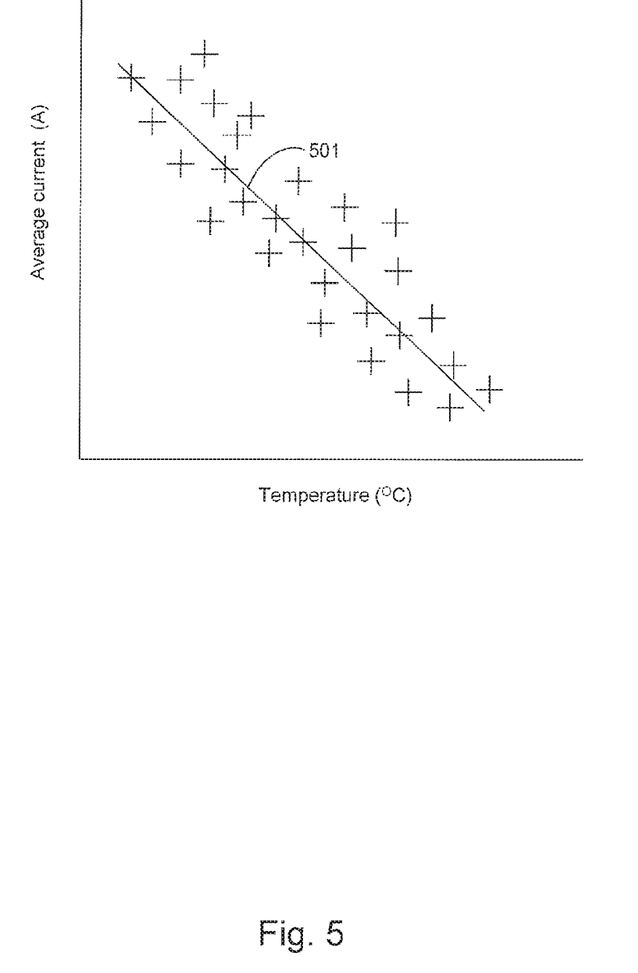
FIG. 5 shows an example of how electrical usage data and temperature data may be analysed in order to generate a model of one of these parameters' dependence on the other, according to an embodiment.

FIG. 5 shows an example of how current data and temperature data may be analysed in order to generate a model of one of these parameter's dependence on the other. Data collected from a points machine shows a reduced average current as a function of increasing temperature. In the present embodiment, the data is fit to a linear function 501. The use of a linear model simplifies the analysis and can yield benefits in terms of reducing the computer processing power required to execute the fitting algorithm. It has been found that linear models are particularly (although by no means exclusively) applicable to DC points machines as such machines are seen to display a clear linear relationship between average current and operating temperature.

Figure 6:
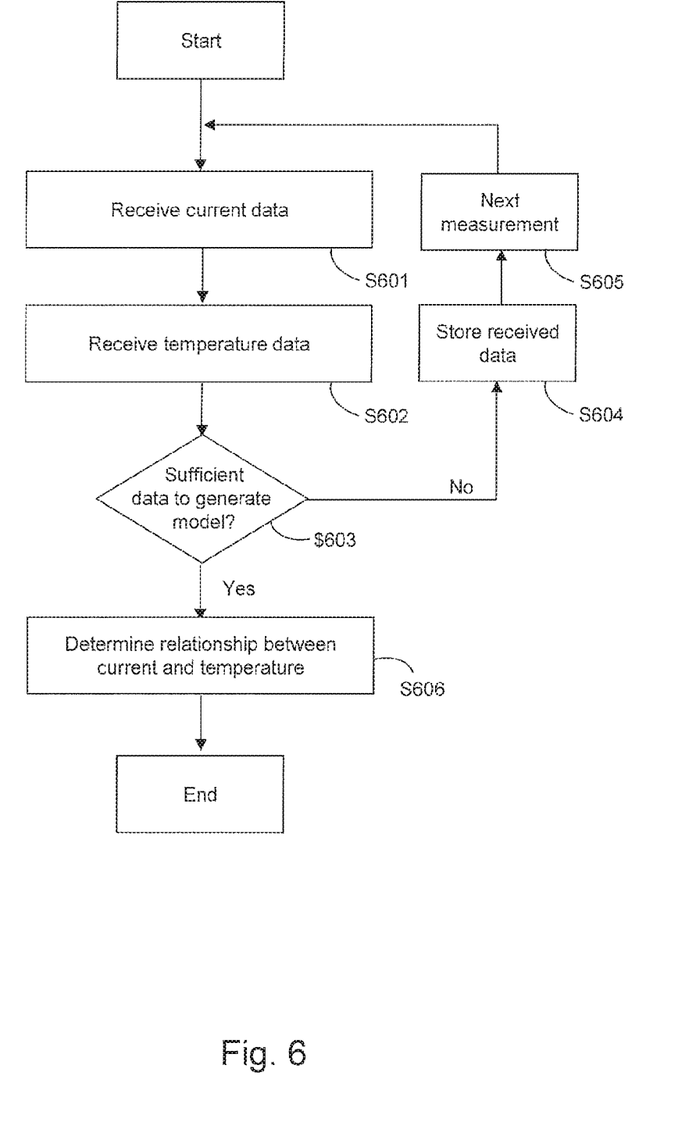
FIG. 6 shows an flow chart of steps involved in generating a model such as that shown in FIG. 5, according to an embodiment.

FIG. 6 shows a flow chart of steps involved in generating a model such as that shown in FIG. 5, according to an embodiment. In step S601, current data is received from a current monitor associated with the points machine. In step S602, temperature data is received that indicates the temperature in the vicinity of the points machine. In step S603, a decision is made as to whether or not sufficient measurements have been made in order to generate the model, and/or whether the quality of the received data is sufficient to generate such a model. For example, in the event that the received current measurements have all been made at the same temperature, it will not be possible to model how the measured current varies as a function of temperature with sufficient accuracy. In the event that further data is required, the method proceeds to step S604, with the received data being stored in memory. When the points machine is next operated (step S605), steps S601 to S603 are repeated and the method proceeds until such time as it is determined in step S603 that sufficient data has been received to generate the model. At this point, the method proceeds to step S606, in which the data is analysed in order to determine a relationship between the average current drawn by the electric motor of the points machine and the ambient temperature.

It will be understood that the data on which the model is based will need to be obtained during a period in which the asset is known to be functioning within acceptable tolerances. To ensure this is the case, the data on which the model is based may be collected shortly after the asset has undergone a standard maintenance procedure.

The model may be generated by any one of well-known mathematical techniques for fitting data to a curve or straight line. For example, linear regression analysis may be used to derive a linear function that expresses the relationship between the ambient temperature and the current that is expected to be drawn by the motor of the points machine.

Figure 7:
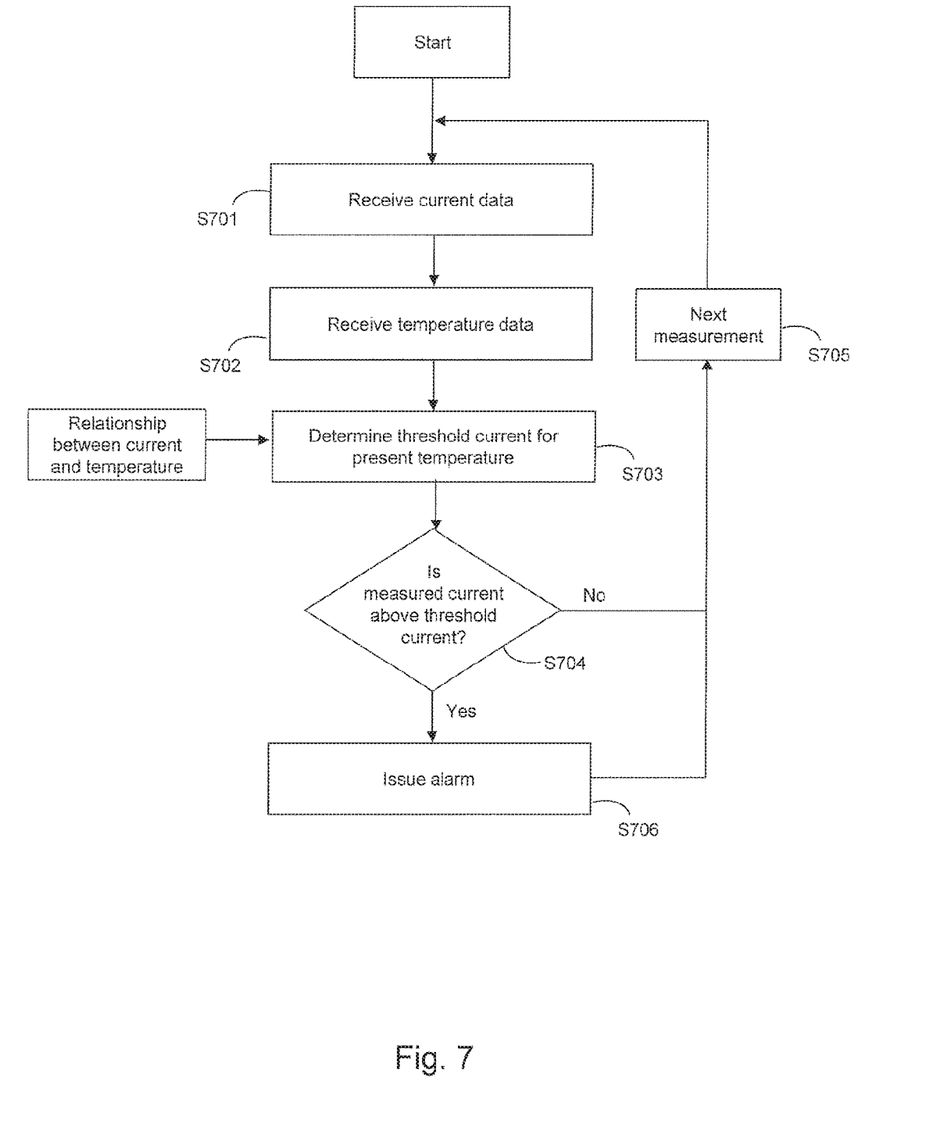
FIG. 7 shows an example of an embodiment in which the relationship between the electrical usage data and temperature data is used in order to determine whether or not the measured value of an electrical usage parameter is indicative of a fault in the points machine.

FIG. 7 shows an example of an embodiment in which the relationship between the current data and temperature data is used to determine whether or not the measured current is indicative of a fault in the points machine. In steps S701 and S702, current data and temperature data is received (it will be understood here that the relationship between the current and temperature data will have already been determined at this stage, based on previously obtained data samples). In step S703, the model relationship between the temperature and average operating current is used to determine a threshold current $I_{Threshold}$, which if exceeded will be considered indicative of a fault in the points machine. The process of determining the threshold current can be understood as follows:

First, assuming a linear relationship between current (I) and temperature (T), the relationship may be expressed as the form:

$$I = mT + C \quad \text{(Equation 1)}$$

where m is the gradient of the line and C is an intercept on the y-axis (i.e. the current axis). Using this relationship, the threshold current $I_{Threshold}$ for the present measurement can be determined as:

$$I_{Threshold} = mT_{Measured} + C + \Delta \quad \text{(Equation 2)}$$

where $\Delta$ is a predetermined constant used to allow for deviations in the measured current from the line used to fit the data.

Having determined the threshold current $I_{Threshold}$, a decision is made in step S704 as to whether or not an alarm should be issued. An alarm will be issued (step S706) in the event that the measured current $I_{Measured}$ matches or exceeds the threshold current $I_{Threshold}$:

$$I_{Measured} \geq I_{Threshold} \quad \text{(Equation 3)}$$

As before, once an alarm has been issued, the process may return to step S701 for the next operation of the points machine.

Figure 8:
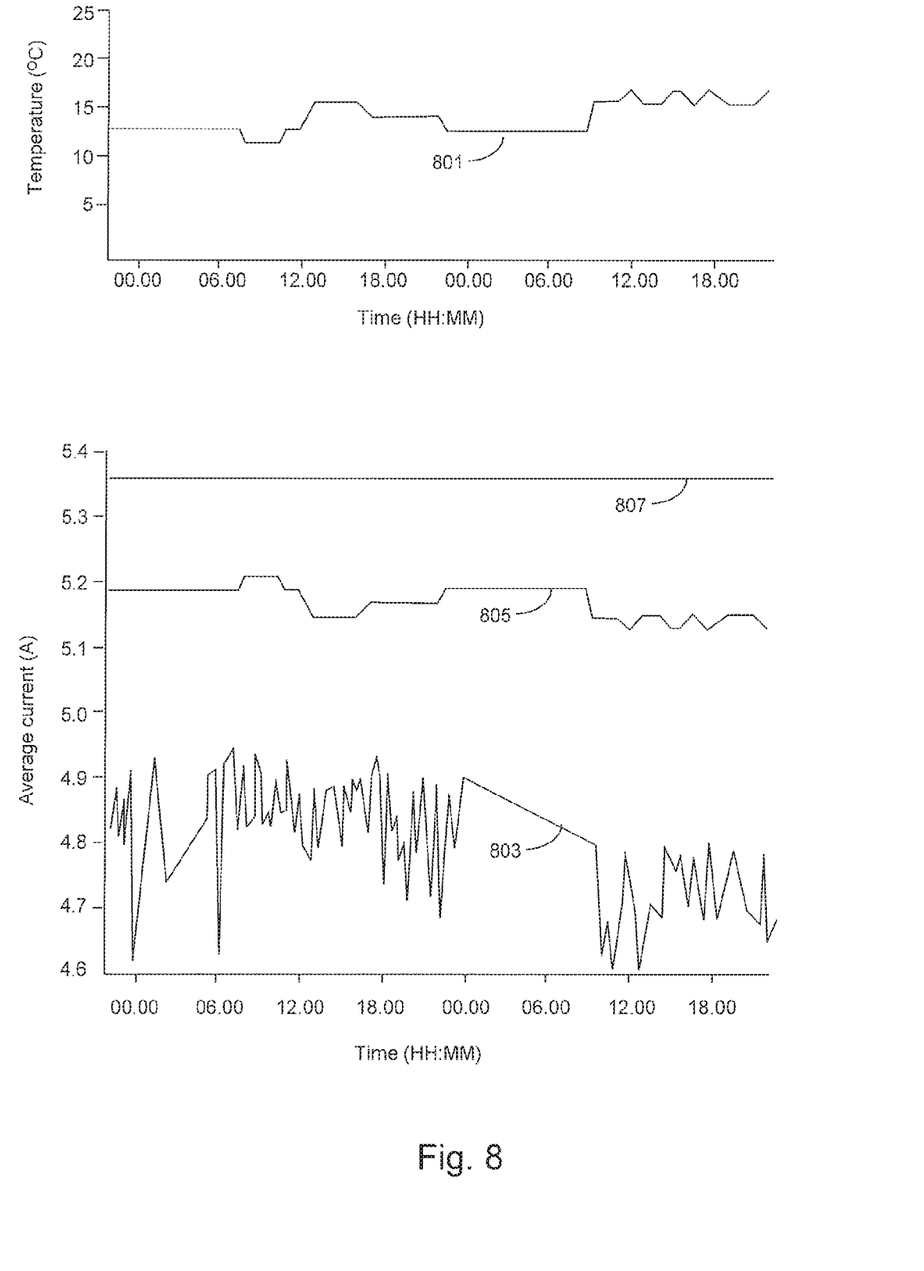
FIG. 8 shows an example of how the threshold current may vary dynamically as a function of temperature in the embodiment of FIG. 7.

FIG. 8 shows an example of how the threshold current $I_{Threshold}$ may vary dynamically as a function of temperature in the embodiment of FIG. 7. FIG. 8A shows a graph of temperature 801 over time; as expected, the temperature is higher during daylight hours. FIG. 8B shows the variation in the average current 803 as measured over the same time period as in FIG. 8A. Also shown in FIG. 8B is the threshold current 805 used to determine whether or not the measured current is indicative of a fault in the points machine. For comparison, a static threshold current 807 as used in a conventional method (and discussed above in relation to FIG. 3) is also depicted in FIG. 8B.

As can be seen, the dynamic threshold 805 varies in accordance with the measured temperature; as the temperature increases, the threshold 805 falls and vice versa. As a result, the method compensates for the effect of temperature when determining if the measured current is indicative of a fault in the points machine.

Figure 9:
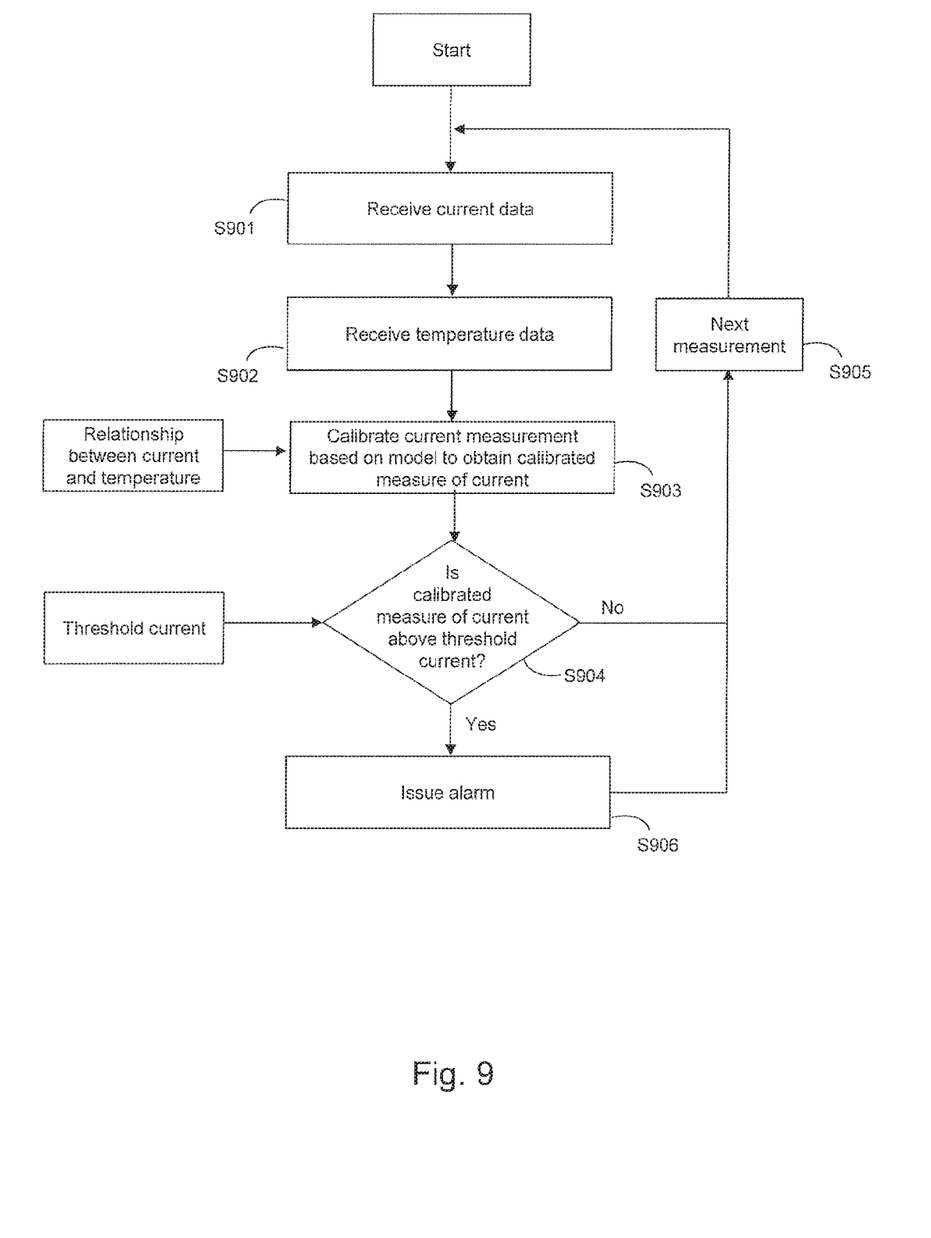
FIG. 9 shows an example of another embodiment in which the relationship between the current data and temperature data is used in order to determine whether or not the measured current is indicative of a fault in the points machine.

FIG. 9 shows an example of another embodiment in which the relationship between the current data and temperature data is used in order to determine whether or not the measured current is indicative of a fault in the points machine. As before, current data and temperature data is received in steps S901 and S902, at which point the received data is used in conjunction with the predetermined relationship between current and temperature to assess the condition of the points machine. In step S903, a recalibration is performed in which the measured current is normalised to a baseline temperature; in other words, the model is used to determine what the measured current would have been in the event that the measured temperature were equal to the baseline temperature. Following this, the recalibrated current measurement is compared against a threshold current that is set for the baseline temperature; if the calibrated current measurement does not exceed the threshold current (step S904), the method proceeds to step S905 and continues with the next operation of the points machine. If, on the other hand, the calibrated measurement does exceed the threshold, an alarm is issued (step S906), before the process repeats from step S901.

It will be noted that in the embodiment of FIG. 9, the performance of an existing system can be improved without having to change the actual thresholding process, making it a relatively non-intrusive addition to such a system.

Embodiments described herein may be implemented within software and can be integrated into existing remote condition monitoring systems with minimal architectural changes. An example is Network Rail's Intelligent Infrastructure (II) system built on the Wonderware platform and using existing data sources.

In summary, embodiments can help to better distinguish true positive alarms and false negative alarms, and enhance not just the maintenance of the asset itself but also the equipment used to monitor the asset performance. The maintenance of a particular asset can also be tailored, for example, by scheduling maintenance at more appropriate intervals, helping to identify serious issues at an earlier stage and so avoiding unexpected failures that could be dangerous and costly. Embodiments can reduce dependence on manual decision and intervention for both setting thresholds and responding to cases in which such thresholds are exceeded.

While certain embodiments have been described, these embodiments have been presented by way of example only and are not intended to limit the scope of the invention. Indeed, the novel methods, devices and systems described herein may be embodied in a variety of forms, and although the specific examples described above have used current as the electrical usage parameter, any one of a number of other electrical usage parameters may be used for determining the condition of the points machine. Furthermore, various omissions, substitutions and changes in the form of the methods and systems described herein may be made without departing from the spirit of the invention. The accompanying claims and their equivalents are intended to cover such forms or modifications as would fall within the scope and spirit of the inventions.

The invention claimed is:

1. A computer-implemented method for alerting a user to the presence of a fault in an electromechanical system in a railway infrastructure, the method comprising:
    receiving electrical usage data indicative of the value of an electrical usage parameter associated with the electromechanical system;
    receiving temperature data indicative of the present temperature of the electromechanical system;
    calibrating the received electrical usage data using the received temperature data and a predetermined relationship between the electrical usage parameter and the temperature to obtain a calibrated measure of the electrical usage parameter, the calibration comprising:
        identifying a baseline temperature at which a threshold for the electrical usage parameter is set, said threshold being such as to indicate the presence of a fault in the electromechanical system, and
        using said relationship, together with the received electrical usage data and the received temperature data, to determine a value for the electrical usage parameter that the system would exhibit in the event that the temperature of the environment were at the baseline temperature; and
    determining whether the calibrated measure of the electrical usage parameter is above the threshold
and if so, issuing an alert to indicate the presence of the fault.

2. A computer implemented method according to claim 1, wherein the predetermined relationship defines the change in the electrical usage parameter as a linear function of the temperature.

3. A computer implemented method according to claim 1, wherein the electrical usage parameter is one of an electrical current being drawn by the electromechanical system, the electrical power being transferred by the electromechanical system, and the voltage across the electromechanical system.

4. A computer implemented method according to claim 1, wherein the predetermined relationship is obtained by comparing measurements of the electrical usage parameter with measurements of temperature during a period in which the electromechanical system is deemed to be functioning within acceptable tolerances.

5. A computer implemented method according to claim 1, wherein the electromechanical system is a point switch machine.

6. A computer-implemented method according to claim 1, wherein the electrical usage data is indicative of the average electrical current drawn by a motor of the electromechanical system during an operation of the motor.

7. A computer readable medium comprising computer executable instructions that when executed by a computer will cause the computer to carry out a method according to claim 1.

8. A non-transitory computer readable storage medium comprising computer executable instructions that when executed by a computer will cause the computer to carry out a method according to claim 1.

* * * * *